United States Patent [19]

Bakeman, Jr. et al.

[11] Patent Number: 5,635,285

[45] Date of Patent: Jun. 3, 1997

[54] METHOD AND SYSTEM FOR CONTROLLING THE RELATIVE SIZE OF IMAGES FORMED IN LIGHT-SENSITIVE MEDIA

[75] Inventors: Paul E. Bakeman, Jr., South Burlington; Albert S. Bergendahl, Underhill, both of Vt.

[73] Assignee: International Business Machines Corporation, Armonk, N.Y.

[21] Appl. No.: 487,368

[22] Filed: Jun. 7, 1995

[51] Int. Cl.$^6$ ............................................. B32B 3/00
[52] U.S. Cl. ............ 428/195; 428/174; 428/179; 428/221; 428/411.1; 428/929; 430/311; 430/312
[58] Field of Search ...................... 428/195, 913, 428/914, 207, 212, 174, 179, 221, 411.1, 929; 430/311, 312

[56] References Cited

U.S. PATENT DOCUMENTS

| | | |
|---|---|---|
| 3,403,024 | 9/1968 | Luce . |
| 3,695,875 | 10/1972 | Ortel . |
| 4,231,811 | 11/1980 | Somekh et al. . |
| 4,456,371 | 6/1984 | Lin . |
| 4,869,999 | 9/1989 | Fukuda et al. . |
| 4,992,825 | 2/1991 | Fukuda et al. . |
| 5,255,050 | 10/1993 | Kitagawa . |
| 5,323,208 | 6/1994 | Fukuda et al. . |
| 5,348,837 | 9/1994 | Fukuda et al. . |

FOREIGN PATENT DOCUMENTS

| | | | |
|---|---|---|---|
| 0503472 A2 | 3/1992 | European Pat. Off. | G03F 7/20 |
| 0571929 A2 | 5/1993 | European Pat. Off. | G03F 1/14 |
| 6215999 | 8/1994 | Japan | H01L 21/30 |

OTHER PUBLICATIONS

Electronic Device Letters vol.EDL-8 No. 4 Apr. 1987 'A New Method for Enhancing Focus Latitude in Optical Lithography': Flex H. Fukuda, N. Hasegawa, T. Tanaka and T. Hayashida.

SPIE vol. 1463 Optical/Laser Microlithography IV 1991 'Binary and Phase-Shifting Image Design for Optical Lithography' Y. Liu and A. Zakhor.

SPIE vol. 1674 Optical/Laser Microlithography V 1992 'Using Multiple Focal Planes to Enhance Depth of Focus' C. A. Spence, D. C. Cole and B. B. Peck.

IBM Technical Disclosure Bulletin vol. 32 No. 3A Aug. 1989 'Control of Photoresist Edge Slope' J. Wuestenhagen.

SPIE vol. 772 Optical Microlithography VI 1987 'A Novel Method for Improving the Defocus Tolerance in Step and Repeat Photolithography' T. Hayashida, H. Fukuda, T. Tanaka and N. Hasegawa.

J. Vac. Sci. Technol.B7(4), Jul./Aug. 1989 'Improvement of Defocus Tolerance in a Half-Micron Optical Lithography by the Focus Latitude Enhancement Exposure Method: Simulation and Experiment' H. Fukuda, N. Hasegawa and S. Okazaki.

*Primary Examiner*—William Krynski
*Attorney, Agent, or Firm*—James M. Leas

[57] ABSTRACT

A method of exposing a radiation-sensitive medium through a mask and using an imaging system having a given depth of focus to control for pattern dependent distortion. The steps comprise: providing the radiation-sensitive medium within the depth of focus of the imaging system; providing radiation to the radiation-sensitive medium through the mask; providing the radiation-sensitive medium fully outside the depth of focus of the imaging system; and providing radiation to the radiation-sensitive medium through the mask. Corrections are automatically made by providing the radiation-sensitive medium fully outside the depth of focus of the imaging system, since in that regime the mask operates as a grey-scale mask, with the amount of light passing through any region of the mask dependent on the transmission of the masking pattern in that region.

8 Claims, 6 Drawing Sheets

+/- 10 PERCENT CD
.25 MICRON L/S, 248 NM, .5 NA, .6 SIGMA

METHOD AND SYSTEM FOR CONTROLLING THE RELATIVE SIZE OF IMAGES FORMED IN LIGHT-SENSITIVE MEDIA

FIELD OF THE INVENTION

This invention relates to optical projection imaging and printing, especially as used in semiconductor device fabrication. More particularly, the invention relates to a method for ensuring proper optical exposure in projecting mask patterns onto a semiconductor wafer coated with photoresist. Even more particularly, the invention relates to a method for ensuring that different patterns on a mask get different exposures to make up for masking pattern differences.

BACKGROUND OF THE INVENTION

Optical projection printing is used in current semiconductor fabrication processes to transfer optical patterns from a transparent plate patterned with light-impermeable material ("a mask") onto a silicon substrate coated with a radiation sensitive medium, such as photoresist. During exposure the resist coated substrate is located at the image plane of an imaging system, such as an optical lithography system. Integrated circuits are built up in a series of conductive and insulative layers, each layer being patterned through photoresist exposure and subsequent etching through the patterned photoresist.

For proper functionality of the circuits the size of the photoresist image must be tightly controlled because photoresist image size determines the sizes of structures, such as devices, gates, contacts, conductors, and insulators comprising the circuit. The photoresist image size is mostly a function of exposure dose and photoresist contrast. Since most photoresists have high contrast, the imaging process can be approximated by a threshold model: below a certain threshold dose of light, none of the exposed photoresist is activated, above the same threshold, all of the exposed photoresist is activated. Thus, upon developing positive-tone photoresist, all the resist exposed with a dose above the threshold is removed, while all the resist exposed with a dose below the threshold remains.

In addition to exposure and contrast, the masking pattern itself can influence photoresist image size. This is especially the case if images within the masking pattern (mask images) are near the resolution limit of the system's imaging capability. In this regime, the exposure threshold depends on specific features of the masking pattern. For example, the exposure dose required to reproduce (or "print") a masking pattern consisting of a single opaque line at or near the resolution limit is higher than that required to print a masking pattern consisting of a group of equi-spaced opaque lines of the same size. The exposure dose required for a masking pattern consisting of a single transparent line of the same size is still different. The difference in exposure threshold between different masking patterns all having mask images that are the same size leads to size differences between the photoresist images when they are all printed with the same exposure dose. Therefore, a mask containing a variety of patterns with mask images at or near the resolution limit of the lens will not be uniformly reproduced in the photoresist by a single exposure.

There has been considerable effort devoted to eliminating this masking pattern-dependent variation in exposure threshold. Commonly assigned U.S. Pat. No. 4,456,371 by Lin (the "'371 patent") teaches several methods of exposing the wafer with a correction mask tailored to the standard mask so that from both the desired exposure is achieved. Each approach requires fabrication of two masks and careful alignment of the two masks.

In an article "Binary and Phase-Shifting Image Design for Optical Lithography", Proceeding of the SPIE, Optical/Laser Microlithography IV, Vol. 1463, (1991) pp. 382–399, Liu and Zakhor teach predistorting images on the mask. The mask is generated using a computer simulation of an optical lithography system that includes the type of mask illumination, the exposure dose, the imaging lens, and the desired photoresist pattern.

U.S. Pat. No. 4,869,999 (the "'999 patent") to Fukuda et al. teaches a method of image enhancement by performing multiple exposures at different focus settings. The effective depth-of-focus of an optical lithography system is found to be improved by repeating exposures focused at various depths within the depth of focus of the imaging system.

A simplified way of minimizing masking pattern-dependent variations in substrate image size that occur in printing mask images that are at or near the resolution limit of the optical lithography system is needed and is provided by the present invention.

SUMMARY OF THE INVENTION

It is therefore an object of the present invention to provide a simple process for printing a mask having images at or near the resolution limit so that substrate image size will be independent of masking pattern.

It is a further object of the present invention to provide a method of printing in which substrate image size is independent of masking pattern using a single mask that has not been predistorted.

It is a feature of the present invention that focused imaging and defocused imaging are used to correct the exposure dose for different masking patterns.

It is an advantage of the present invention that a single mask is used and no additional alignment is needed to provide masking pattern independent reproduction of mask images.

These and other objects, features, and advantages of the invention are accomplished by a method of exposing a radiation-sensitive medium through a mask with an imaging system having a given depth of focus, the steps comprising: providing the radiation-sensitive medium within the depth of focus of the imaging system; providing radiation to the radiation-sensitive medium through the mask; providing the radiation-sensitive medium fully outside the depth of focus of the imaging system; and providing radiation to the radiation-sensitive medium through the mask.

In another aspect of the invention, a structure is formed on a substrate with an imaging system having a given resolution limit, the substrate comprising: a first region having a first masking pattern having a first substrate image having a first substrate image size and a first spatial frequency, a second region having a second masking pattern having a second substrate image having a second substrate image size and a second spatial frequency, the second spatial frequency substantially larger than the first spacial frequency, the second substrate image size at or near the resolution limit; the first and second regions formed with a single mask having first and second mask images corresponding to the first and the second substrate images, the mask images not predistorted to correct for spacial frequency dependent linewidth bias; and wherein the first and the second substrate image sizes are substantially identical.

In brief, the invention utilizes the pattern on the mask itself to change the exposure at each masking pattern. For example, to print a masking pattern composed of a group of lines, less exposure is desired relative to the exposure needed to print an isolated line to compensate for diffraction. This variable exposure can be accomplished by exposing the wafer out-of-focus such that the light that reaches the edge of the isolated line actually came from the area where an adjacent line would exist if the pattern were composed of a group of lines. The defocused exposure dose to the isolated line will be greater because the area adjacent to the line is clear. This selectively biases the isolated line narrower than the grouped line to correct for the opposite effect when the mask is exposed in focus.

In practicing this invention as described above two exposures are required, one in focus and one out-of-focus. The ratio of these exposures will govern the bias between grouped and isolated lines. The exposures can be sequential in either order or both exposures can be accomplished simultaneous. Simultaneous exposure is accomplished if an extra optical element is inserted into a fourier transform plane to alter the focal plane of that portion of the numerical aperture. This element can be adjustable like an iris to adjust the amount of out-of-focus exposure and hence, the isolated to grouped line bias.

BRIEF DESCRIPTION OF THE DRAWINGS

FIG. 3b shows the images in the photoresist produced by the aerial images illustrated in FIG. 3a;

FIG. 4a is a top schematic view of a mask with several patterns;

FIG. 4b is a top schematic view of a gray-scale mask associated with the mask shown in FIG. 4a;

DETAILED DESCRIPTION OF THE INVENTION

In optical lithography, the relative size difference between the photoresist images created from same-size mask images in different masking patterns and printed at a single exposure level, depends primarily on how close the mask images are in size to the resolution limit of the optical lithography system. For a mask image that is large compared to the resolution limit of the optical lithography system, the light illuminating the mask image diffracts from the mask image at a relatively low angle, and nearly all the diffracted light still falls within the collection numerical aperture of the imaging lens of the optical lithography system. Thus, the optical lithography system will faithfully print such a mask image in photoresist and maintain its respective proportions over a relatively wide range of exposure. On the other hand, mask images that are close to or at the resolution limit of the optical lithography system will diffract light at greater angles. Much more of the diffracted light will be deflected outside the collection numerical aperture of the imaging lens. In addition, the mount of light lost due to diffraction depends on the masking pattern. Where several masking patterns having mask images of different shapes or spacial frequencies are imaged at once, the fidelity of the printing will vary among the masking patterns because diffraction creates a different exposure for each masking pattern.

The resolution limit (R) and depth of focus (D) of an optical lithography system depend on factors including the coherence of the illumination, the size and shape of the image, and the numerical aperture (NA) of the imaging lens on the image side of the lens ("image space").

Figure 1:
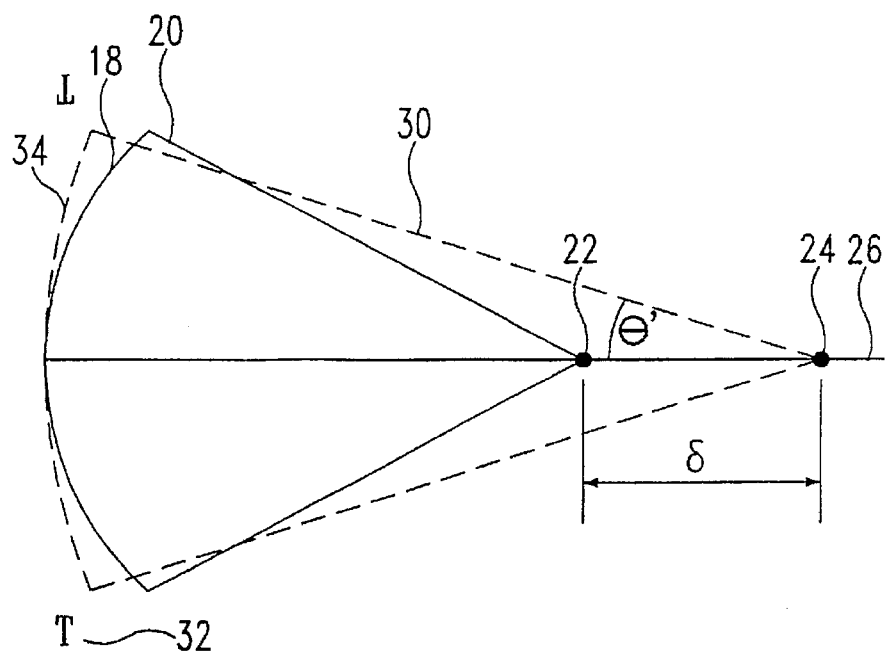
FIG. 1 illustrates the relationship between axial defocus and wavefront defocus and shows the angle that defines the numerical aperture of the imaging lens of an optical lithography system.

Referring to FIG. 1, NA is defined by the equation NA=n sin θ, where n is the index of refraction of the image space medium (usually air, with n=1) and θ is the angle between optical axis 26 and marginal ray 30. In semiconductor manufacturing, a rule of thumb for the resolution limit of any optical lithography system is given by the relation R≈0.6 λ/NA, where λ is the wavelength of the illumination. The rule of thumb for depth of focus is D≈±λ/(2 NA$^2$), where the depth of focus is defined as the allowable axial defocus δ about the optimal focus position wherein a mask pattern will still print with acceptable sharpness.

Defocus can also be thought of as wavefront aberration. As shown in FIG. 1, perfect focus wavefront 18 emanates from imaging lens exit pupil 32, and converges to point 22 on optical axis 26, while defocused wavefront 34 converges to point 24, a distance δ away. Wavefront aberration W is the distance separating the two wavefronts as measured at the edge of exit pupil 32 and is also a measure of the defocusing. Wavefront aberration W is usually measured in "waves", or units of wavelength, such as "2 λ" or "λ/4". The relationship between wavefront aberration W in waves and axial defocus δ is given by W≈0.5 NA$^2$δ. Thus, for δ=D, the rule of thumb depth of focus D corresponds to a quadratic wavefront aberration W, of λ/4 from the in-focus reference wavefront, as measured at the edge of exit pupil 32.

Figure 2:
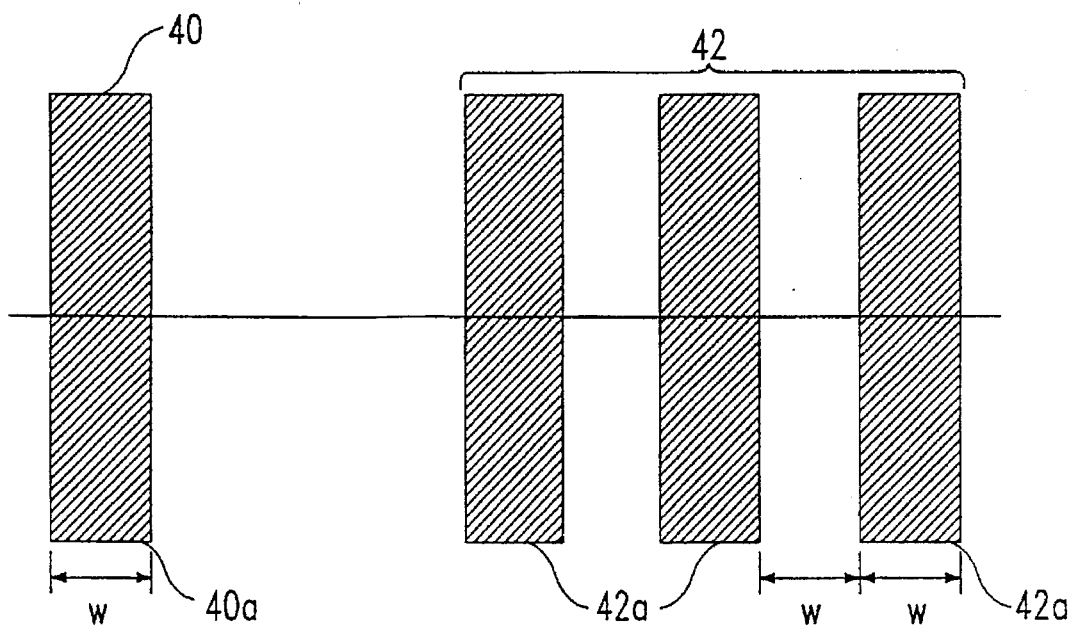
FIG. 2 shows two different masking patterns with the same linewidth.

FIG. 2 depicts two masking patterns 40 and 42 having same-size mask images but different spacial frequencies. Masking pattern 40 includes image 40a that is an isolated opaque line of width w, and masking pattern 42 has a group of images 42a that are opaque lines, each identical to image 40a, and each separated by a distance equal to its width w. Such masking patterns are formed by depositing a thin layer of light-impermeable material, such as chrome, on a transparent, dielectric substrate, such as quartz.

Figure 3A:
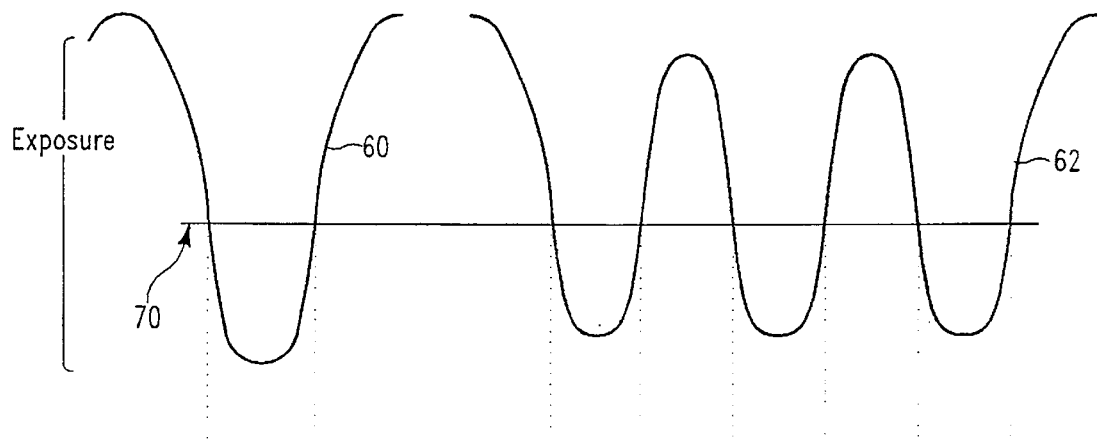
FIG. 3a shows the aerial images of the masking patterns in FIG. 2.
Figure 3B:
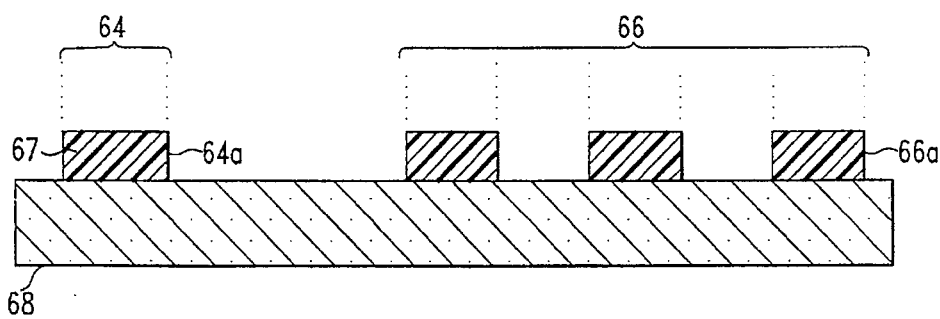

FIG. 3a shows the exposure of each aerial image 60 and 62 of masking patterns 40 and 42, respectively, when imaged with an optical lithography system of wavelength λ, numerical aperture NA, and resolution limit R≈0.6 λ/NA. The image formed at the image plane in the absence of photoresist is called the "aerial image" and is measured in units of irradiance. For threshold exposure 70, photoresist images 64a and 66a in photoresist patterns 64 and 66 (FIG. 3b) formed in photoresist layer 67 on substrate 68 have sizes related to aerial images 60 and 62. It is seen that, even though the width w of mask images 40a and 42a in masking patterns 40 and 42 (FIG. 2) are identical, the sizes of corresponding photoresist images 64a and 66a differ. In this case, the mask pattern-dependent difference in image size is known as spacial frequency-dependent linewidth bias.

The present invention provides a simple method of reducing, eliminating or even reversing the masking pattern-dependent bias that occurs when printing a mask in an optical lithography system. In brief, the method involves exposing a single mask comprising two or more different patterns, to both focused and grossly defocused beams. In the defocused exposure, the mask becomes, in effect, a grey-scale transmission mask. In the defocused exposure the resist is fully outside the depth of focus of the imaging system. The defocused exposure is approximately uniform within each mask region, but the intensity varies between mask regions in proportion to the relative overall optical transmission of each mask region, and that transmission depends on the masking pattern of that mask region. In a sense, the standard mask, sufficiently defocused takes the place of the correction mask described in the '371 patent. The defocused exposure thus modifies the aerial images formed during the in-focus exposure. The defocused exposure is significantly smaller than the focused exposure, up to about 15%, but typically between 2% and 5% of the focused exposure. The two exposures can be made in either order or simultaneously.

Figures 4A, 4B:
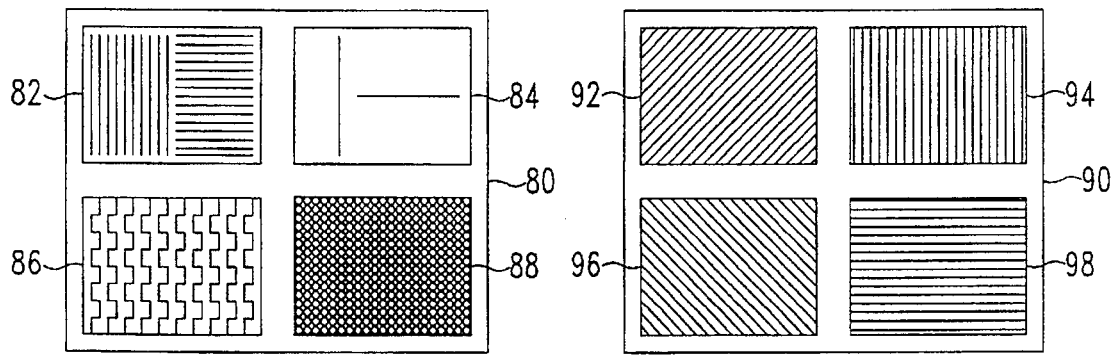

In order to create the effect of a gray-scale from discrete patterns on a mask by using defocus, the aerial images of the mask patterns must be sufficiently blurred. In essence, the introduction of defocus serves to reduce the resolving capacity of an optical lithography system so that the masking patterns, while resolvable in the optimum focal region, become sub-resolution and hence unresolvable in a suitably defocused plane. Masking patterns that are unresolvable by an optical lithography system will have significantly reduced modulation, with those patterns falling far below the resolution limit having near zero modulation, and hence gray-scale aerial images. This effect is illustrated in FIG. 4, which shows a mask 80 with several patterns, namely grouped lines 82, isolated lines 84, zig-zag lines 86 and an array of opaque dots 88. With sufficient defocus, the mask 80 becomes, in effect, the gray-scale transmission mask 90, with each pattern having an optical transmission in proportion to its ratio of chrome to glass. The amount of light exposing a region of the photoresist depends on the relative proportion of chrome to glass on the corresponding region of the mask, and that depends on the masking pattern of that mask region.

The '999 patent incorporated herein by reference, teaches several methods of adjusting the focus. In brief, defocus is achieved by providing the photoresist layer, the lens, or the mask at a position along the optical axis different from that of the in-focus position. Alternatively, the imaging properties of dioptric microlithographic imaging lenses are known to be sensitive to slight changes in the imaging wavelength, temperature and pressure, and these parameters can be adjusted to defocus. The same is true for catadioptric microlithographic lenses, though to a lesser extent if the system operates at unit magnification, or if the magnification power resides mostly in the mirror elements. Defocusing can also be carried out in a doubly telocentric system by displacing the mask along the optical axis of the imaging lens in either direction. Where such a system has a magnification m, the axial defocus on the mask side ("object space"), δ', is related to the axial defocus in the image space by the relation δ=m²δ'.

Figure 5A:
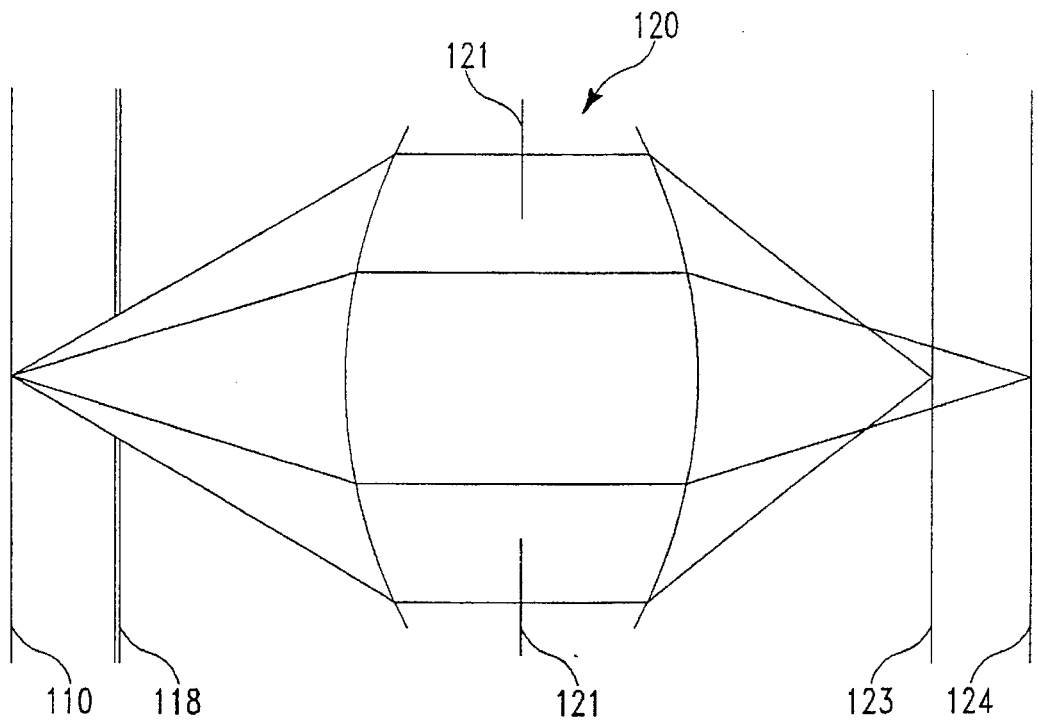
FIG. 5a–5b illustrate the effect of axial image plane defocus on several different image points for an image-side telocentric optical lithography system.
Figure 5B:
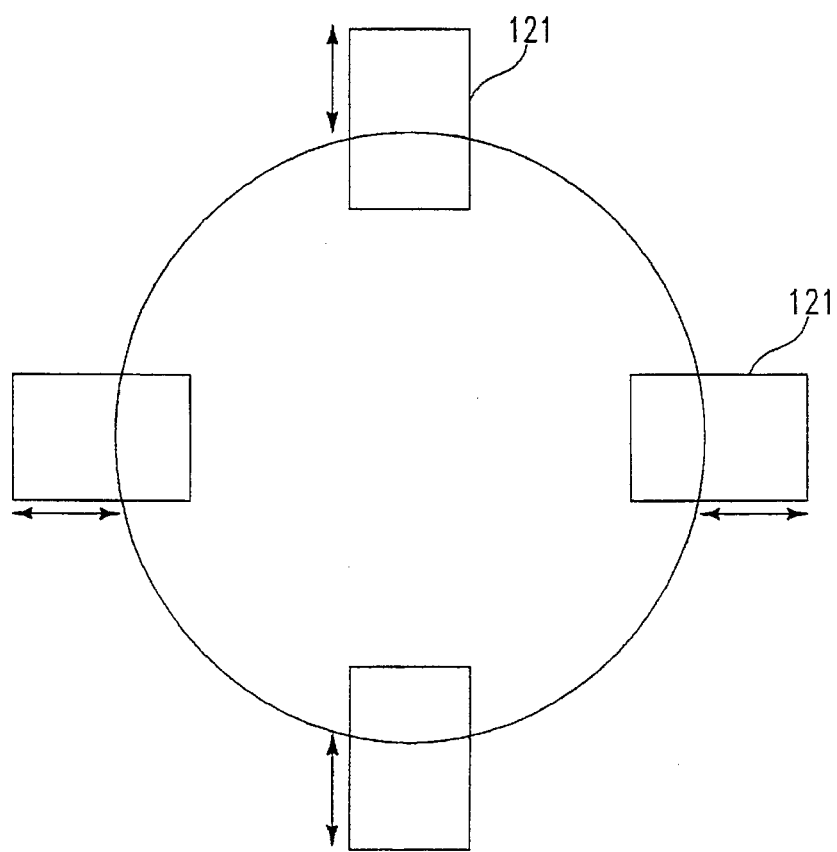

FIGS. 5a–5b show how simultaneous exposure is accomplished if an extra optical element is inserted into a Fourier transform plane to alter the focal plane of that portion of the numerical aperature. As will be seen hereinbelow, this element can be adjustable like an iris to adjust the amount of out-of-focus exposure and hence, the isolated to grouped line bias. FIG. 5a shows a view along the optical axis and FIG. 5b shows a view perpendicular to the optical axis of the optical system.

Extra optical element 121 may be one or more lenses or thin sheets of an optically transpatent material, such as quartz, which are inserted substantially perpendicularly to the optical axis of the imaging system at the outer edges of a Fourier transform plane of lens 120 so as to intersect a fraction of the light emanating from all locations on masking plane 110. Elements 121 will effectively lengthen the optical path from the object plane and shift the focal point of the light passing through them to position 123 closer or further from lens 120. Hence, the image created by the fraction of light passing through elements 121 will be de-focused in a manner similar to that which would occur if the substrate were physically moved out of focus. The amount of light reaching the substrate in the defocused condition is proportional to the percentage of the Fourier transform plane area into which elements 121 extend. As the typical out-of-focus illumination is expected to be less then 5% of the total dose, only a small portion of the Fourier transform plane area need be covered by elements 121. It is recommended that at least four-fold symmetry about the optical axis be maintained in the insertion of elements 121 such that lines oriented in perpendicular directions on the exposed photo-sensitive material are affected equally. Further the areal coverage of the Fourier transform plane can be adjusted by mechanically moving elements 121 into and out of the optical path in a direction perpendicular to the optical axis of the system as illustrated by arrows in FIG. 5b.

Light passing through the optical system along paths 125 which do not pass through elements 121 focus on image plane 124. However those rays that pass through elements 121 focus on plane 123 which lies in front or in back of of image plane 124. Hence, elements 121 effectively provide a means for providing in-focus and out-of-focus images at the image plane simultaneously. The thickness of elements 121 may be varied to adjust the amount of defocusing, and the position of elements 121 may be varied to adjust the out-of-focus to in-focus exposure ratio. Hence, adjustable control of pattern dependent linewidth compensation is achieved.

Figure 6A:
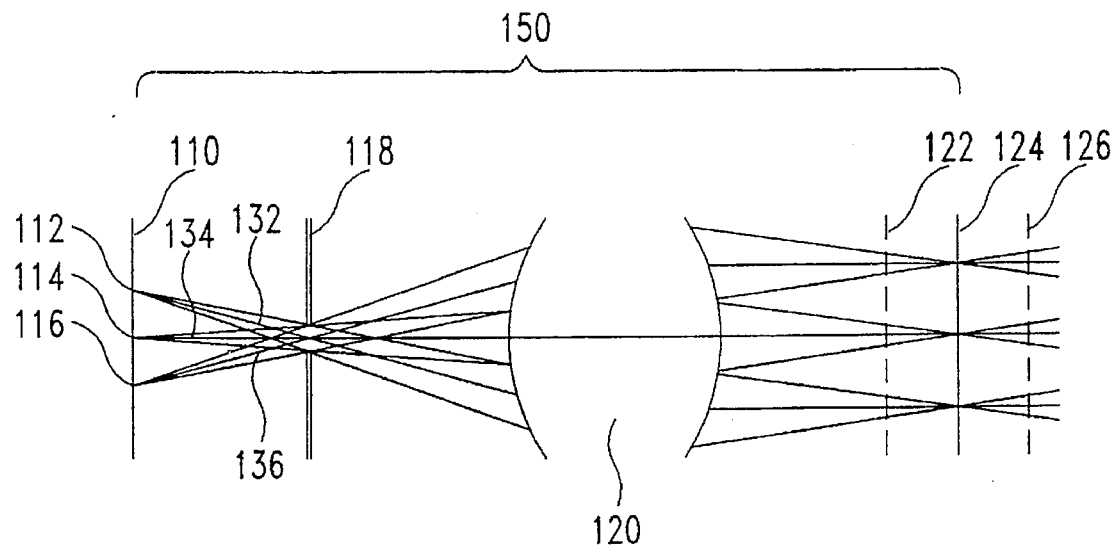
FIG. 6 is a close-up view of image planes 124 and 126 shown in FIG. 5 and the light passing therethrough.
Figure 6B:
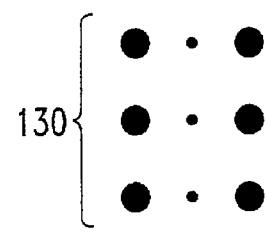

There are several considerations in determining the magnitude of defocus needed. Because of the sensitivity of the performance of integrated circuits to image placement errors, optical lithography systems are typically telocentric at least in the image space, so that a focus error results only in a symmetric blurring of the aerial image and not a displacement (magnification) of the aerial image as a function of focus. This is illustrated schematically in FIGS. 6a–6b. FIG. 6a shows a potion of an image-side telocentric optical lithography system 150, consisting of mask plane 110, entrance pupil 118, imaging system 120 and image planes 122, 124, and 126. Imaging system 120 can include a lens, a mirror, or other optical components. Ray bundles 132, 134, and 136 are traced from left to right through system 150 from mask points 112, 114 (on axis), and 116 respectively. On the image side of imaging lens 120, ray bundles 132, 134, and 136 are intercepted by in-focus plane 124, and out-of-focus planes 122 and 126, equally spaced on either side of in-focus plane 124, with plane 122 displaced axially towards imaging lens 120 and plane 126 displaced axially away from imaging lens 120. The spot images that would appear on screens 122, 124, and 126 are illustrated by dots 130 in FIG. 5b. The symmetry of dots 130 reflect the symmetry of ray bundles 132, 134, and 136 about in-focus plane 124.

Figure 7:
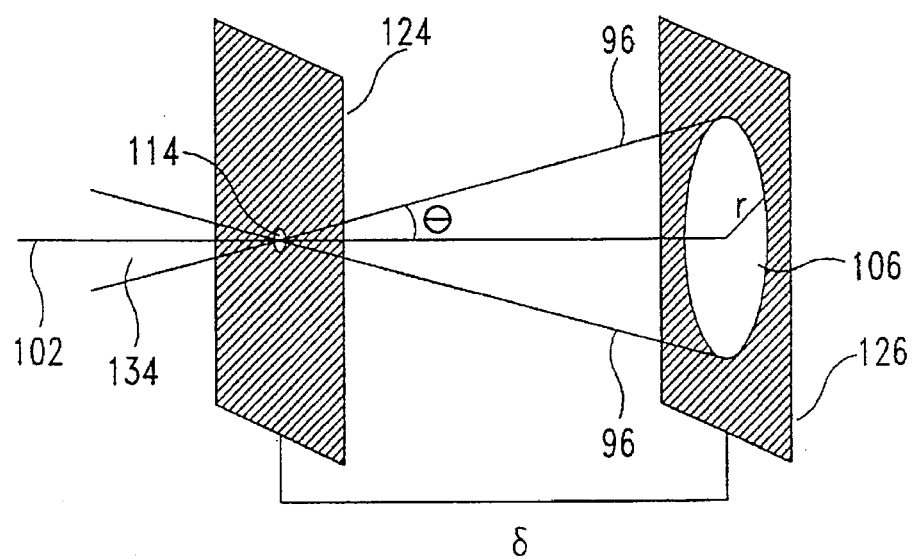
FIG. 7 shows how a mask having a square box of length ε on a side grows with axial defocus for an image-side telocentric optical lithography system.

FIG. 7 shows a closer view of imaging planes 124 and 126 of FIG. 6a and illustrates in more detail the effect of axial defocus on the size of a point image for an image-side telocentric imaging system. Bundle of rays 134, can be thought of as passing marginal rays 96 and central ray 102, through hole 114 in in-focus image plane 124 and striking defocus plane 126. There rays 134 define circular image 106 of radius r. Defocus plane 126 is a distance $\delta$ away from in-focus plane 124. Angle $\theta$ is related to the NA of the imaging lens 120 (FIG. 6a) via the relation $\theta \approx \sin^{-1}[NA/n]$. Radius r of circle 106 formed on plane 126 is described by the relation $r \approx \delta \tan \theta$, indicating that circular image 106 grows linearly with defocus.

Figure 8:
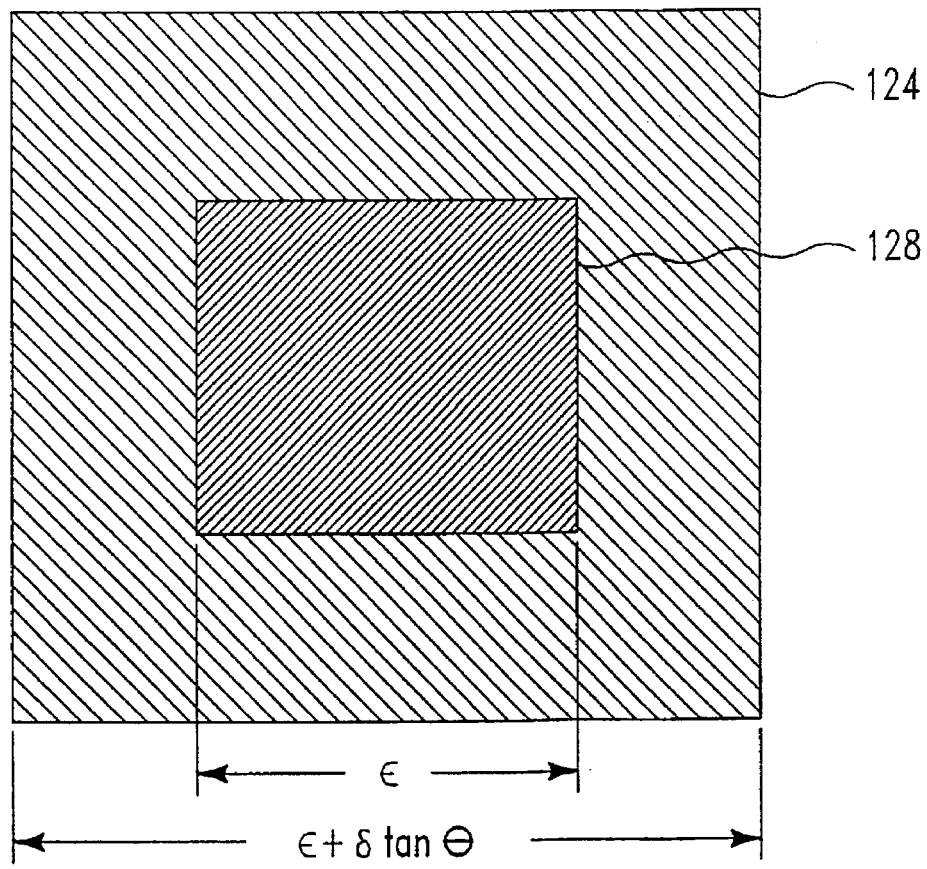
FIG. 8 is a graphical representation of the aerial image of a periodic mask pattern illustrating the definition of modulation.

As shown in FIG. 8, in-focus square 128 measuring $\epsilon$ on each side and having area $A_0 \approx \epsilon^2$ will similarly expand its area with defocus $\delta$ to form larger square 124 according to the formula $A_S \approx [\epsilon + \delta \tan \theta]^2$. As an example, for square mask pattern 128, measuring 10 µm, and an image-side telocentric optical lithography system with an NA≈0.5 (operating at unit magnification and in air so that n≈1), focused square 128 will measure 10 µm on a side ($\epsilon \approx 10$ µm, $A_0 \approx 100$ µm$^2$). With a defocus value of $\delta$=5 µm, and an image-side telocentric optical lithography system with an NA=0.5 (operating at unit magnification and in air so that n=1), so $\theta$=30° and defocused square 124 will measure 10 µm+(5 µm)(0.577)≈12.88 µm on a side and cover an area of 166 µm$^2$. Because of this expansion of the projected area of the image with defocus, it will often be desirable to determine the minimum focus required to sufficiently blur the pattern for the defocused exposure in order to prevent overlapping exposure of adjacent masking patterns projected onto the wafer. In addition, by the law of conservation of irradiance, the total light incident on the area of box 128 is the same as that on box 124, so the irradiance decreases as $(\delta \tan \theta)^2$, i.e., in proportion to the square of the defocus. This means that a greater defocus would require a longer secondary exposure time, which increases the manufacturing processing time for each wafer.

It is common practice in semiconductor manufacturing to conduct focus and exposure experiments for a given optical lithography system, wafer processing procedure and mask level, to empirically determine the best process window. In regards to focus, the optimal focal position or "best focus" is generally determined by qualitative evaluation. While the precise techniques vary, they involve a trained operator looking at a series of lines or other mask patterns exposed at various focal distances to determine where the photoresist patterns appear the sharpest or clearest, and then operating the system at that focus setting. This technique is described in "Research Disclosures", April 1986, Number 264, Disclosure Number 26, 433 published by Kenneth Mason Publications, Ltd., England. This same technique can be applied to the present invention to determine the best defocus, by examining the clarity of photoresist patterns of different shapes and sizes at various focal distances to determine at which defocus values the patterns first appear sufficiently blurred, and then operating the optical lithography system at that defocus value for the defocusing exposure.

U.S. Pat. No. 4,890,239, incorporated herein by reference, teaches a lithographic process analysis and control system for controlling photoresist pattern linewidth based on a predetermined mathematical model that analyzes inputted measurement data, such as focus, exposure, and photoresist pattern measurements. This technique can be applied to facilitate determining the defocus value.

Figure 9:
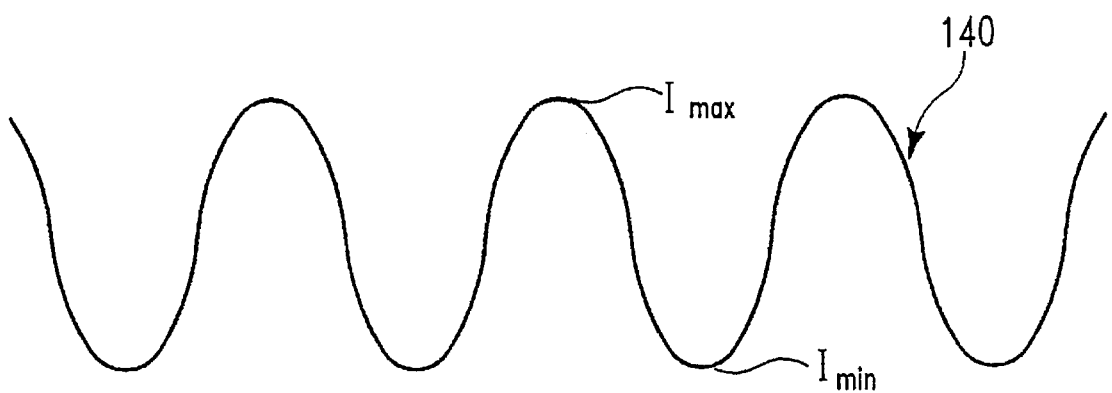
FIG. 9 is a plot of the modulation transfer function (MTF) for an imaging lens with a circular pupil for several values of defocus.

The amount of defocus required to give suitable results for an application of the present invention can also be deduced by invoking the aerial image quality criteria discussed by W. B. Wetherell in the article "The Calculation of Image Quality", in Applied Optics and Optical Engineering, R. Shannon and J. C. Wyant, eds., Vol. 8 of *Optical Engineering* (Academic, New York, 1980), pp. 171–315. For instance, the proper amount of defocus required for mask patterns consisting of grouped-lines, like masking pattern 42 shown in FIG. 2, can be determined from the modulation transfer function (MTF) of the optical lithography system. The MTF of an optical system describes the degree of modulation in the image of a sine-wave amplitude transmission grating pattern of the form $T(x) \propto (1+\cos[2\pi f x])$ where f represents the spatial frequency of the pattern in the x direction. FIG. 9 is a graphical representation of an aerial image 140 of such a periodic structure, with the maximum irradiance and the minimum irradiance defined as Imax and Imin, respectively. The modulation is defined as M=(Imax−Imin)/(Imax+Imin). For a chrome-on-glass periodic grating pattern, the chrome is typically opaque, with no gray-level. The transmission of the pattern is binary and is represented by a square wave with the chrome areas having a transmission of 0 and the transparent glass areas having a transmission of 1. For such a grating, the MTF is related to the modulation M via the relation MTF=($\pi$/4) M, so that the MTF is a very good approximation of the modulation of near resolution limit periodic binary mask features for incoherent light. MTF is also a good approximation for partially coherent optical systems.

Figure 10:
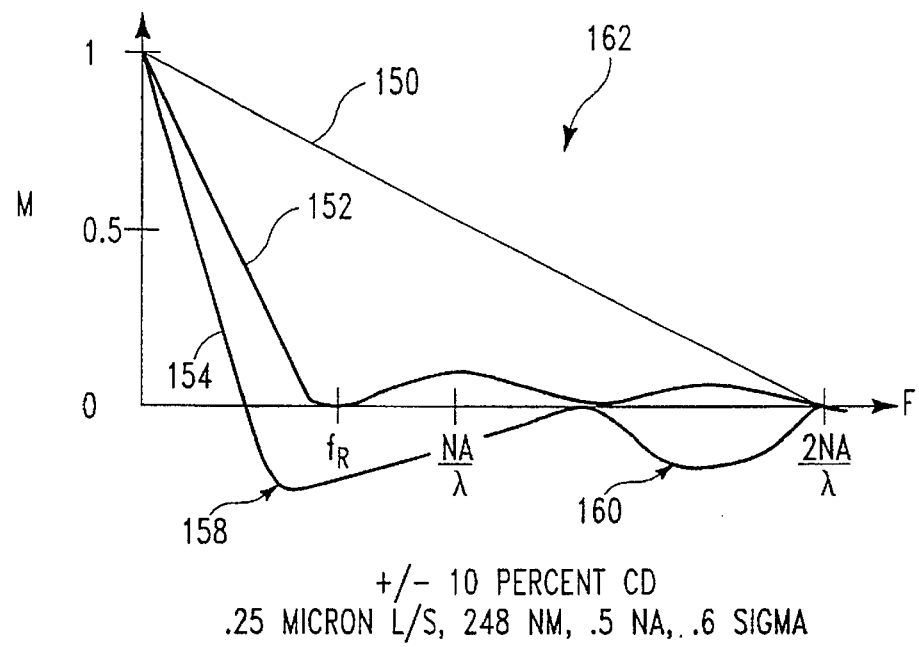
FIG. 10 is a graphical representation of variation in photoresist pattern linewidth with focus and exposure, called an "E-D plot", which depicts the "process window" for a given feature.

FIG. 10 depicts a slice along one spatial frequency axis of generic MTF plots 162 for an imaging lens with a circular pupil for various defocus values of the wavefront. The vertical axis is the modulation M and the horizontal axis represents the spatial frequency F of a sinusoidal periodic grating. Resolution limit modulation for integrated circuit fabrication is approximately in the range of 50% to 60%, corresponding to a spatial frequency of approximately 0.8 NA/$\lambda$ (FIG. 9, curve 150), indicated by $f_R$ and is equivalent to the resolution limit linewidth of about 0.6 $\lambda$/NA. Curve 150 is the MTF curve for a system without any defocus aberrations, or W=0. In curve 152, representing a wavefront defocus of W=$\lambda$/2, M drops down to zero in the region around $f_R$. In curve 154, representing a wavefront defocus of W=$\lambda$, M drops off even more rapidly to zero and has negative regions 158 and 160. Negative modulation signifies that the image is "phase-reversed", meaning that the bright and dark areas in the aerial image exchange positions. Though the modulation is small in these phase-reversed regions, it may be desirable to avoid operating at such defocus values because a phase-reversed secondary exposure serves to "undo" the primary, in-phase exposure. On the other hand, if such an effect is sought, a defocus value which gives the maximum phase-reversed modulation should be used. In the limit as the wavefront defocus W becomes much greater than $\lambda$, the MTF plot is described by a Bessel function, (that is the fourier transform of the geometrical optics prediction for the impulse response of the lens). With W=$\lambda$, curve 154 in FIG. 9 is already a very good approximation to the Bessel function form. Thus, the "steady state"

of the MTF curve is essentially achieved at about W=λ, which corresponds to a defocusing of four times the rule of thumb depth of focus D for resolution-limit periodic patterns. Thus, it is best if the amount of defocus is at least enough to provide the photoresist fully outside the depth of focus of the imaging system, and an upper limit on the amount of defocus needed is the wavelength of the radiation.

In deriving a more precise value of defocus suitable for performing a secondary exposure using an optical lithography system arranged to perform partially coherent imaging, the approach described by Lin in the article "Partially coherent imaging in two dimensions and the theoretical limits of projection printing in microfabrication", IEEE Trans. Electron Devices, ED-27, p. 931, 1980 can be applied. The article describes a method of creating an E-D plot by plotting contours of variation in photoresist linewidth as a function of exposure dose (E) and defocus (D) for a given mask pattern. These plots define the exposure and focus process window for the mask pattern and can be combined with E-D plots for other mask patterns to find the overall process window for the combination of mask patterns by examining the E-D region common to all the patterns simply by overlapping the diagrams. Such plots are easily generated by computer simulation of the optical lithography system under study. Computer programs capable of generating such diagrams are available from Finle Technology, P.O. Box 162712, Austin, Tex., 78716. However, care should be taken in performing any computer simulation of an optical lithography system where large amounts of defocus are used, since not all programs properly treat large aberrations.

Figure 11:
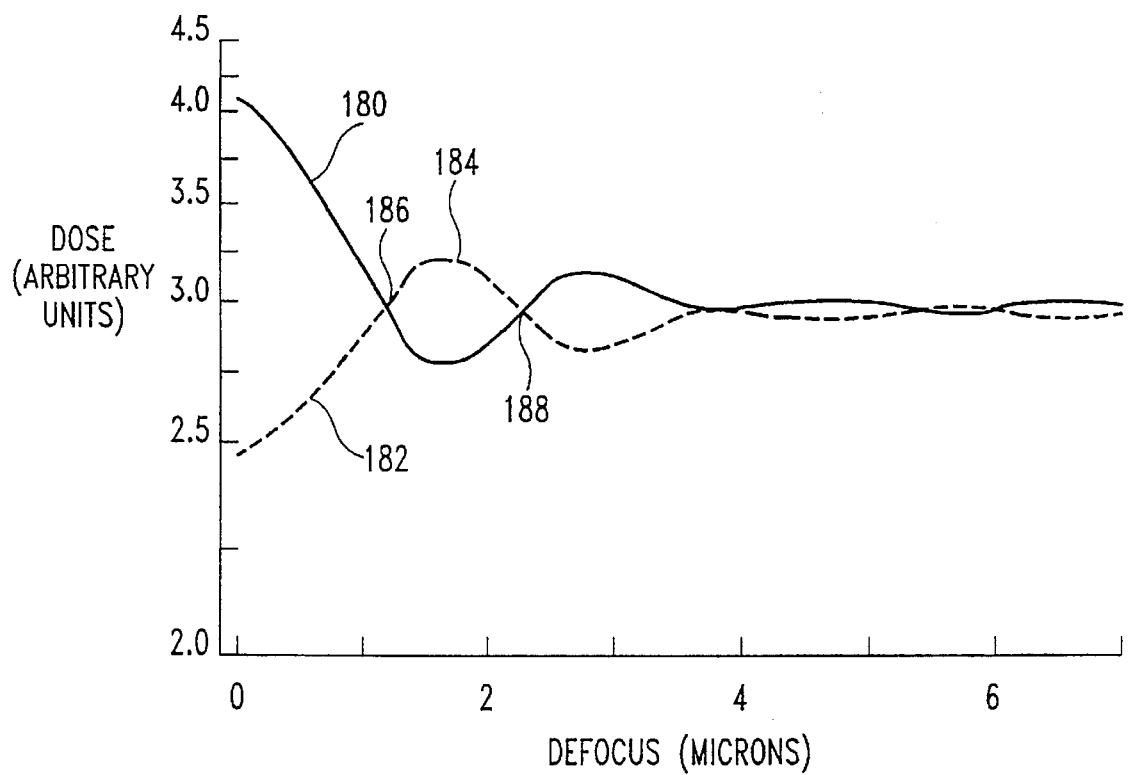
FIG. 11 is a computer generated "E-D plot" for a grouped line pattern.

FIG. 11 is a computer-generated E-D plot for a grouped line pattern, similar to masking pattern 42 (FIG. 2), as imaged with an optical lithography system having a numerical aperture of 0.5, a partial coherence factor of 0.6 and an effective operating wavelength of 0.25 µm. Two contours 180 and 182 represent a variation in photoresist pattern linewidth of +10% and −10% respectively, about the nominal linewidth of 0.25 µm. As shown in FIG. 10 at a value of 1 µm defocus, the window between the contours "disappears" at node 186 and then opens up again slightly between 1 µm and 2 µm, but phase-reversed. The window disappears again at the node 188 at about 2 µm defocus, and then opens up in-phase between 2 µm and 3 µm. Because each individual mask pattern has its own depth of focus, generating E-D plots for each pattern allows one to find the defocus value where the modulation is negligible and, for all intents and purposes, is a uniform blanket exposure. Note that, because of the small dose and the threshold nature of high contrast photoresist, the secondary exposure does not have to be absolutely uniform, so that the defocused aerial image can have slight variations in irradiance over the exposed field. Therefore, through the use of E-D plots one can ascertain to within a reasonable degree the amount of defocus required to implement the present invention, either by directly constructing E-D plots that incorporate the double exposure sequence, or by simply examining the E-D plots for the individual mask patterns and finding the value of defocus in which the image is sufficiently blurred. E-D plots can also be determined empirically by printing mask patterns over a range of focus and exposure and plotting the matrix of data.

The present invention, provides a method for tailoring the relative sizes of two or more images in a radiation-sensitive medium such as photoresist by exposing the resist to create both focused and defocused images of the mask patterns in the radiation-sensitive medium. With the defocused exposure the resist receives radiation in proportion to the masking patterns optical transmission in each region. While the present description uses the application to photolithography as applied to the manufacturing of semiconductor devices, it is to be appreciated by those skilled in the art that the method may be used for other purposes such as a microscope or other type of optical projector, where illuminating radiation diffracts from objects such that their images are not faithfully reproduced in a recording medium.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. Structures on a substrate formed with an imaging system having a resolution limit, comprising;

a first structure on a first substrate region having a first masking pattern comprising a first substrate image having a first substrate image size, said first substrate image size at or near the resolution limit of the imaging system;

a second structure on a second substrate region having a second masking pattern comprising a second substrate image having a second substrate image size, said second substrate image size at or near the resolution limit of the imaging system, wherein said second masking pattern has an optical transmission substantially different from said first masking pattern;

said first and second structures defined by the same single mask having first and second mask images corresponding to said first and said second substrate images, said mask images not predistorted to correct for masking pattern dependent linewidth bias; and wherein said first and said second substrate images are substantially undistorted by masking pattern dependent linewidth bias.

2. Structures as recited in claim 1 wherein said first masking pattern has a first spatial frequency and said second masking pattern has a second spacial frequency, said second spacial frequency being substantially larger than said first spacial frequency, and wherein said first mask image is identical to said second mask image, wherein said first and said second substrate image sizes are substantially identical.

3. Structures as recited in claim 1, wherein the substrate is a semiconductor chip.

4. Structures as recited in claim 1, wherein said first and second structures comprise one of conductive lines, gates, doped regions, contacts, and insulators.

5. Structures formed on a substrate with an imaging system having a resolution limit, comprising:

a first structure on a first region having a first masking pattern having a first substrate image having a first spacial frequency and a first substrate image size;

a second structure on a second region having a second masking pattern having a second substrate image having a second spatial frequency and a second substrate image size, said second spatial frequency substantially larger than said first spacial frequency, said second substrate image size at or near the resolution limit of the imaging system;

said first and second structures defined by the same single mask having first and second mask images corresponding to said first and said second substrate images, said mask images not predistorted to correct for spacial frequency dependent linewidth bias; and wherein said first substrate image size is substantially the same as said second substrate image size.

6. Structures as recited in claim 5, wherein said first masking pattern comprises an isolated feature and said second masking pattern comprises a grouped feature.

7. Structures as recited in claim 5, wherein the substrate is a semiconductor chip.

8. Structures as recited in claim 5, wherein the first and second images comprise one of conductive lines, gates, doped regions, contacts and insulators.

* * * * *